United States Patent
Zimmerman et al.

(10) Patent No.: US 11,537,534 B2
(45) Date of Patent: Dec. 27, 2022

(54) HIGH THROUGHPUT, LOW POWER, HIGH PARITY ARCHITECTURE FOR DATABASE SSD

(71) Applicant: Western Digital Technologies, Inc., San Jose, CA (US)

(72) Inventors: Israel Zimmerman, Ashdod (IL); Mahmud Asfur, Bat-Yam (IL); Mordekhay Zehavi, Raanana (IL)

(73) Assignee: Western Digital Technologies, Inc., San Jose, CA (US)

( * ) Notice: Subject to any disclaimer, the term of this patent is extended or adjusted under 35 U.S.C. 154(b) by 77 days.

(21) Appl. No.: 17/181,907

(22) Filed: Feb. 22, 2021

(65) Prior Publication Data

US 2022/0058140 A1 Feb. 24, 2022

Related U.S. Application Data

(60) Provisional application No. 63/068,331, filed on Aug. 20, 2020.

(51) Int. Cl.
| | |
|---|---|
| *G06F 13/16* | (2006.01) |
| *G06F 15/80* | (2006.01) |
| *H03M 13/11* | (2006.01) |
| *G06F 16/23* | (2019.01) |
| *G06F 11/10* | (2006.01) |

(52) U.S. Cl.
CPC ........ *G06F 13/161* (2013.01); *G06F 11/1004* (2013.01); *G06F 13/1668* (2013.01); *G06F 15/80* (2013.01); *G06F 16/2379* (2019.01); *H03M 13/1102* (2013.01)

(58) Field of Classification Search
CPC ............... G06F 13/161; G06F 13/1668; G06F 16/2379; G06F 11/1004; G06F 15/80; H03M 13/1102
See application file for complete search history.

(56) References Cited

U.S. PATENT DOCUMENTS

| | | | |
|---|---|---|---|
| 9,679,661 B1 * | 6/2017 | Guo | G11C 16/08 |
| 2015/0043926 A1 * | 2/2015 | Levy | H04L 25/03292 |
| | | | 398/202 |
| 2018/0217751 A1 * | 8/2018 | Agarwal | G11C 16/10 |
| 2019/0132007 A1 * | 5/2019 | Weinberg | G06F 11/1076 |
| 2019/0354300 A1 * | 11/2019 | Benisty | G06F 3/0634 |
| 2020/0328916 A1 * | 10/2020 | Nikitin | H04B 1/1027 |

* cited by examiner

*Primary Examiner* — Henry Tsai
*Assistant Examiner* — John B Roche
(74) *Attorney, Agent, or Firm* — Patterson & Sheridan, LLP; Steven H. VerSteeg

(57) ABSTRACT

A method and apparatus for the increase of internal data throughput and processing capability for SSD's, to enable processing of database commands on an SSD. A front-end ASIC is provided with 256 to 512 RISC processing cores to enable decomposition and parallelization of host commands to front-end module (FM) ASICs that each in turn are coupled to multiple NVM dies, as well as processing of host database operations such as insert, select, update, and delete. Each FM ASIC is architected to increase parity bits to 33.3% of NVM data, and process parity data with 14 LDPC's. By increasing the parity bits to 33.3%, BER is reduced, power consumption is reduced, and data throughput within the SSD is increased.

20 Claims, 4 Drawing Sheets

HIGH THROUGHPUT, LOW POWER, HIGH PARITY ARCHITECTURE FOR DATABASE SSD

CROSS-REFERENCE TO RELATED APPLICATIONS

This application claims benefit of U.S. Provisional Patent Application Ser. No. 63/068,331, filed Aug. 20, 2020, which is herein incorporated by reference.

BACKGROUND OF THE DISCLOSURE

Field of the Disclosure

Embodiments of the present disclosure generally relate to solid state data storage devices (SSD), and more particularly, to SSD configuration for sequential file access and processing.

Description of the Related Art

Databases are typically implemented on host systems, comprising dedicated processors, memory, and storage. When carrying out a database operation such as a select, insert, update, or delete, an application provides instructions to the host system that, in turn, call data from storage and perform the requested operation in memory. The result of the operation is provided to the application and/or written to storage as needed.

Developers have not typically sought to implement database operations, for example, on data storage devices. Although capable of storing large amounts of data, typical data storage devices lack data throughput, processing capability, and parallelism to efficiently carry out database operations.

What is needed are systems and methods that overcome the shortcomings of prior approaches, to enable database operations to be efficiently carried out on data storage devices.

SUMMARY OF THE DISCLOSURE

The present disclosure generally relates to systems and methods for an increase of internal data throughput and processing capability for SSD's, to enable processing of database commands on an SSD. In one embodiment, a front-end ASIC is provided with 256 to 512 RISC processing cores to enable decomposition and parallelization of host commands to front-end module (FM) ASICs that each, in turn, are coupled to multiple NVM dies, as well as the processing of host database operations such as select, update, insert, and delete. Each FM ASIC is architected to increase parity bits to 33.3% of NVM data, and process parity data with 14 LDPC's. By increasing the parity bits to 33.3%, BER is reduced, power consumption is reduced, and data throughput within the SSD is increased.

In one embodiment, a data storage device is disclosed, comprising a front-end module ASIC (FM ASIC) comprising a plurality of LDPC engines, a plurality of flash interface modules (FIMs), each FIM coupled to a respective one of a plurality of NVM dies capable of storing data, and a front-end ASIC (FE ASIC) comprising a plurality of processing cores and coupled to the FM ASIC, configured to receive a database instruction from a host comprising one of a select, an insert, an update and a delete instruction, and executing the database instruction with the plurality of processing cores within the data storage device.

In another embodiment, a solid state storage device is disclosed, comprising a front-end ASIC (FE ASIC) configured to be coupled to a host, and a front-end module ASIC (FM ASIC) coupled to one or more NVM dies, and having a bit error rate (BER) of about 0.2 or less, the FM ASIC coupled to the FE ASIC.

In another embodiment, a device for storing data is disclosed, comprising one or more memory means configured to store data, a front-end module ASIC (FM ASIC) means coupled to the one or more memory means, the FM ASIC means configure to have a bit error rate (BER) of less than at least about 0.2, and a front-end ASIC (FE ASIC) means coupled to the FM ASIC means, configured to carry out database commands from a host, the database commands comprising one of a select, an insert, an update, and a delete.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure relates to systems and methods for an increase of internal data throughput and processing capability for SSDs, to enable processing of database commands on an SSD. In one embodiment, a front-end ASIC is provided with 256 to 512 RISC processing cores to enable decomposition and parallelization of host commands to front-end module (FM) ASICs that each, in turn, are coupled to multiple NVM dies, as well as the processing of host database operations such as select, update, insert, and delete. Each FM ASIC is architected to increase parity bits to 33.3% of NVM data, and process parity data with 14 LDPCs. By increasing the parity bits to 33.3%, BER is reduced, power consumption is reduced, and data throughput within the SSD is increased.

Figure 1:
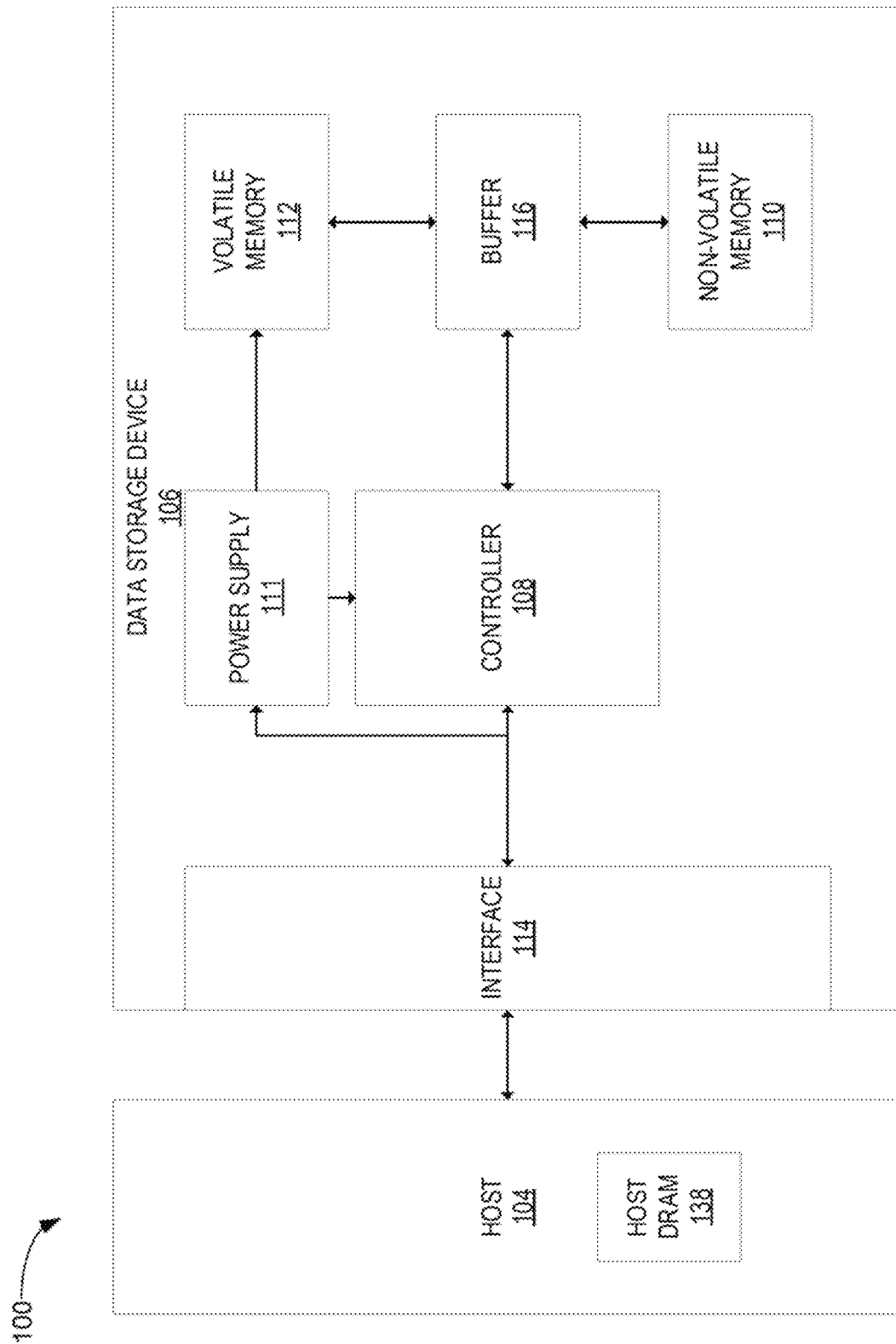
FIG. 1 is a schematic block diagram illustrating a storage system in which a data storage device may function as the data storage device for a host device, according to disclosed embodiments.

FIG. 1 is a schematic block diagram illustrating a storage system 100 in which data storage device 106 may function as a storage device for a host device 104, according to disclosed embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The storage system 100 includes a host device 104, which may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
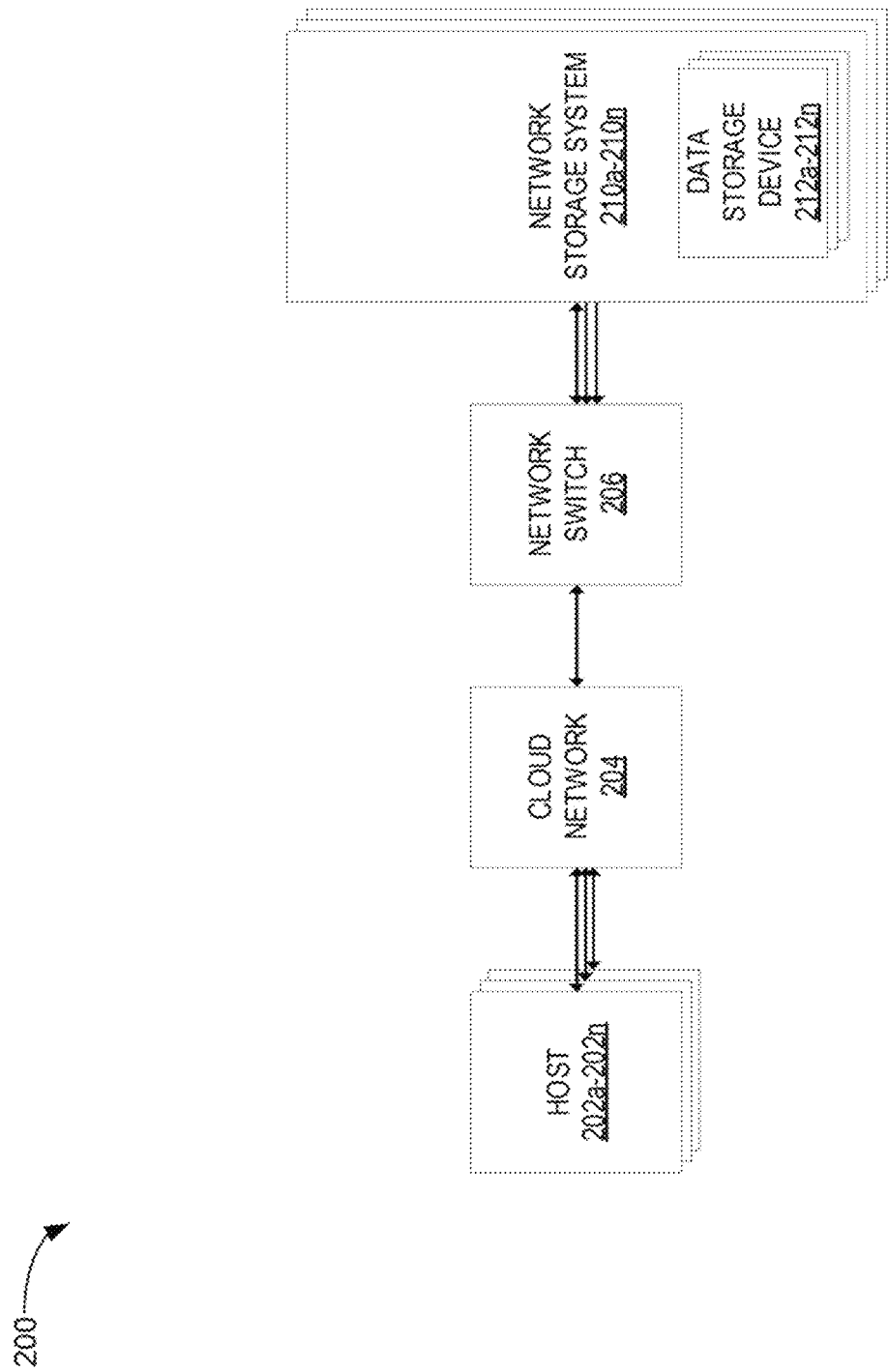
FIG. 2 is a schematic block diagram illustrating a database server system, according to disclosed embodiments.

FIG. 2 is a schematic block diagram illustrating a database server system 200, according to disclosed embodiments. The database server system includes one or more host devices 202a-202n, where each of the one or more host devices 202a-202n may be the host device 104 of FIG. 1, a cloud network 204, a network switch 206, and one or more network storage systems 210a-210n. Each of the network storage systems 210a-210n includes one or more data storage devices 212a-212n, where each of the one or more data storage devices 212a-212n may be the data storage device 106 of FIG. 1 or 304 of FIG. 3, discussed below.

The one or more host devices 202a-202n may be connected to the cloud network 204 via methods of network data transfer, such as Ethernet, Wi-Fi, and the like. The cloud network 204 is connected to the network switch 206 via methods of network data transfer, such as Ethernet, Wi-Fi, and the like. The network switch 206 may parse the incoming and outgoing data to the relevant location. The network switch 206 is coupled to the one or more network storage systems 210a-210n. The data from the one or more host devices 202a-202n are stored in at least one of the one or more data storage devices 212a-212n of the one or more network storage devices 210a-210n.

For example, the one or more network storage systems may be configured to further parse incoming data to the respective one or more data storage devices 212a-212n as well as retrieve data stored at the respective one or more data storage devices 212a-212n to be sent to the one or more host devices 202a-202n. The one or more host devices 202a-202n may be configured to upload and/or download data via the cloud network 204, where the data is uploaded and/or stored to at least one of the one or more data storage devices 212a-212n of the one or more network storage systems 210a-210n. It is to be understood that "n" refers to a maximum number of described components of the database server system 200. For example, the one or more data storage devices 212a-212n may be about 1 data storage device, about 2 data storage devices, or any number greater than about 2 data storage devices.

Figure 3:
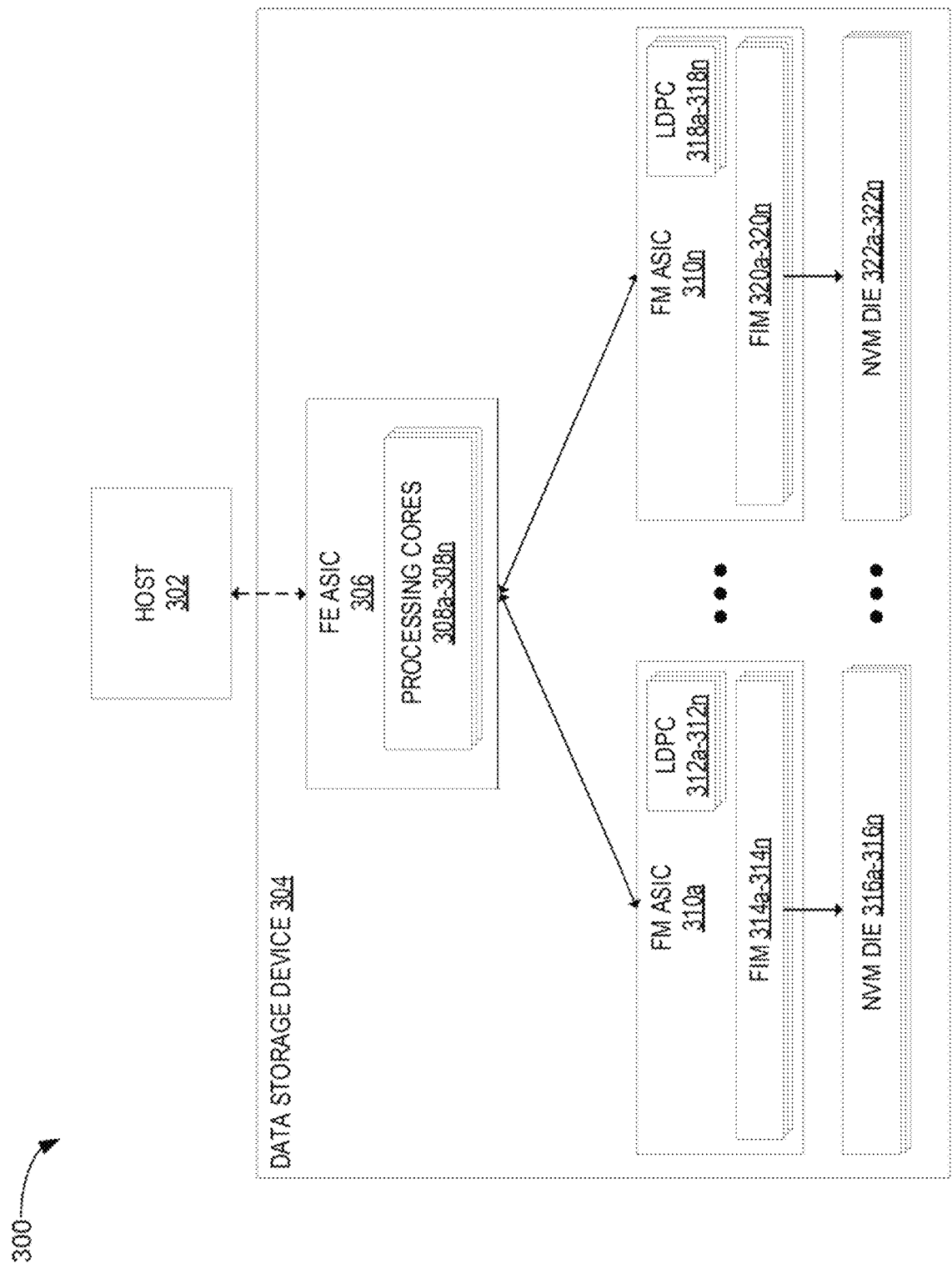
FIG. 3 is a schematic block diagram illustrating an improved data storage device, according to disclosed embodiments.

FIG. 3 is a schematic block diagram of a storage system 300 illustrating an improved data storage device 304, according to disclosed embodiments. The storage system 300 may be the database server system 200 of FIG. 1. For example, the data storage device 304 may be implemented as one or more data storage devices 212a-212n of the one or more network storage systems 210a-210n, and the host device 302 may be implemented as the one or more host devices 202a-202n of FIG. 2. It is to be understood that the data storage device 304 may include additional components not shown in FIG. 3 for the sake of clarity. In one embodiment, the data storage device 304 may be an E1.L enterprise and data SSD form factor (EDSFF).

The data storage device 304 includes a front-end (FE) application-specific integrated circuit (ASIC) 306, a first front-end module (FM) ASIC 310a, and an nth FM ASIC 310n. In the embodiments described herein, the "n" refers to a maximum number of described components of the data storage system 304. For example, the data storage device 304 may include about 10 FM ASICs, where the nth or "n" number of FM ASICs is equal to about 10. The data storage device 304 further includes one or more NVM dies 316a-316n, 322a-322n. Furthermore, the data storage device 304 may include a plurality of FM ASICs (indicated by the ellipses), where each of the FM ASICs of the plurality of FM ASICs are coupled to a respective NVM die of the plurality of NVM dies 316a-316n, 322a-322n. It is to be understood that while a plurality of FM ASICs and a plurality of NVM dies coupled to each of the FM ASICs of the plurality of FM ASICs are described, the data storage device 304 may include a single FM ASIC coupled to a single NVM die or a single FM ASIC coupled to a plurality of NVM dies. In one embodiment, the NVM is NAND memory, where each of the plurality of NVM dies are NAND dies. In one embodiment, the plurality of NVM dies 316a-316n, 322a-322n of the data storage device 304 are bit cost scalable (BiCS) 6 NVM dies. The BiCS 6 NVM dies may have improved operating speeds and lower power consumption than previous versions such as BiCS 5 NVM dies.

The plurality of FM ASICs 310a-310n each comprise a plurality of low-density parity-check (LDPC) engines 312a-312n, 318a-318n and a plurality of flash interface modules (FIMs) 314a-314n, 320a-320n. Each of the plurality of FIMs 314a-314n, 320a-320n are coupled to a respective NVM die of the plurality of NVM dies 316a-316n, 322a-322n. In one embodiment, each FIM is coupled to a respective NVM die. In another embodiment, each FIM is coupled to a respective about four NVM dies. The plurality of LDPC engines 312a-312n, 318a-318n, may be configured to generate LDPC codes or parity data. The LDPC codes and the parity data may be attached to the respective incoming data to be written to the respective NVM die of the plurality of NVM dies 316a-316n, 322a-322n. In one embodiment, the FM ASIC includes about 14 LDPC engines. In another embodiment, the FM ASIC includes less than about 54 LDPC engines.

The LDPC codes and the parity data may be utilized to find and fix erroneous bits from the read and write process to the plurality of NVM dies 316a-316n, 322a-322n. In one embodiment, a high failed bit count (FBC) corresponds to an error correction code (ECC) or parity data size of about 10.0%. In another embodiment, a low FBC corresponds to the ECC or parity data size of about 33.3%. When the ECC or parity data size is increased from about 10.0% to about 33.3%, the FBC decreases as the data includes more capability to find and fix failed or erroneous bits. In another embodiment, each NVM die of the plurality of NVM dies 316a-316n, 322a-322n includes between about 10.0% and about 33.3% of ECC or parity data associated with the respective stored data. Furthermore, each NVM die of the plurality of NVM dies 316a-316n, 322a-322n may have a bit error rate (BER) of about 0.2 or less than about 0.2. By including more ECC or parity data with the respective data stored in the NVM dies 316a-316n, 322a-322n, the BER may be decreased or improved, such that the BER has a value closer to about 0. The table below describes a power consumption and read performance improvement by increasing the amount of ECC or parity data to be stored on each NVM die of the plurality of NVM dies 316a-316n, 322a-322n.

TABLE 1

|  | FBC High (ECC size ~= 10.0%) | FBC Low (ECC size ~= 33.3%) |
| --- | --- | --- |
| Read Performance (GB/s) | 1.2 | 4.7 |
| Power Consumption (Watt) | 0.200 | 0.120 |
| NVM Die Per FM | 27 | 7 |
| Total Data Storage Device Capacity (TB) | 5.56 | 4.69 |
| Total Power Consumption (W) | 29.348 | 24.832 |

The listed values in Table 1 are not intended to be limiting, but to provide an example of a possible embodiment. Though the total data storage device capacity is lower when the ECC or parity data size is about 33.3% (i.e., FBC low) than when the ECC or parity data size is about 10.0% (i.e., FBC high), the read performance is increased from about 1.2 GB/s to about 4.8 GB/s, and the power consumption decreases from about 0.200 Watt (using about 10.0% parity size, or high BER engine) to about 0.120 Watt (using about 33.3% parity size, or low BER engine). Thus, the data storage device 304 may have improved power consumption and read performance when the ECC or parity data size is greater.

The FE ASIC 306 includes a plurality reduced instruction set computer (RISC) processing cores 308a-308n. In the description herein, the RISC processing cores 308a-308n may be referred to as processing cores 308a-308n, for exemplary purposes. Although RISC processing cores are described, in embodiments other types of processing cores may be utilized, such as CISC, or other processor architecture. For example, the FE ASIC 306 may include a number of processing cores greater than about 5 processing cores. In another embodiment, the number of processing cores is about 256 processing cores and about 512 processing cores. Each of the plurality of processing cores 308a-308n are configured to receive and execute a database instruction from the host 302. The database instruction may include one of a select, an update, and an insert instruction. The database instruction may further include a delete instruction in addition to the previously mentioned instructions. Furthermore, when receiving a database instruction from the host 302, the FE ASIC 306 may allocate an appropriate number of processing cores of the plurality of processing cores 308a-308n to complete the requested database instructions.

Figure 4:
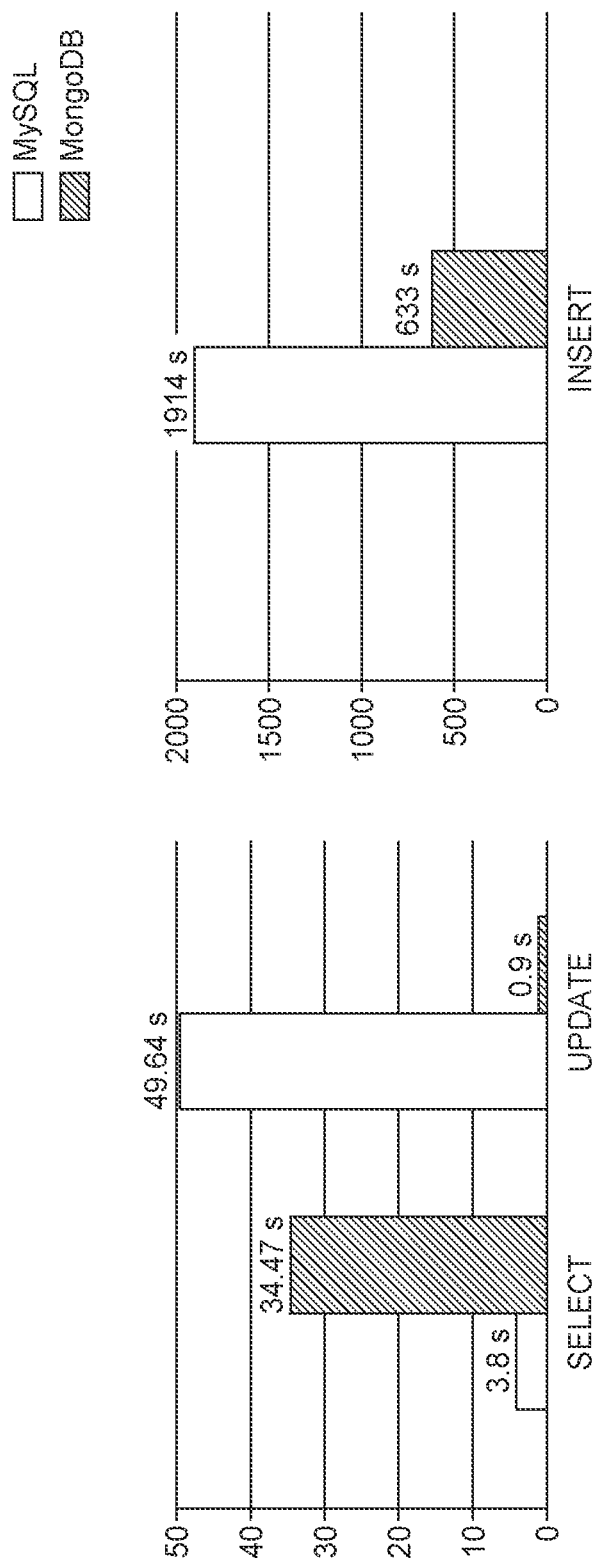
FIG. 4 illustrates the select, update, and insert timing of various databases, according to disclosed embodiments.

FIG. 4 illustrates the select, update, and insert timing of various databases, according to disclosed embodiments. The two databases shown in FIG. 4 are MySQL and MongoDB. The select command is used to retrieve one or more values (i.e., data), such as a row or a cell, from one or more tables of a database. The update command is used to update one or more values, such as a row or a cell, from one or more tables of the database, where the update command updates the relevant data retrieved from the select command. The insert command is used to insert one or more values, such as a row or a cell, to one or more tables of the database. It is to be understood that while select, update, and insert commands are exemplified, other database commands, such as a delete command, are relevant and relatable to the disclosed embodiments.

In the select timing, the MySQL has about a 3.8 second completion time, and the MongoDB has about a 34.47 second completion time. In the update timing, the MySQL has about a 49.64 second completion time, and the MongoDB has about a 0.9 second completion time. In the insert timing, the MySQL has about a 1,914 second completion time, and the MongoDB has about a 633 second completion time. The listed times are not intended to be limiting but to provide examples of possible embodiments. Generally, the MongoDB has a faster completion time than the MySQL database. Furthermore, when queries are coupled together, such as a select query and an update query, MongoDB has a faster completion time than that of MySQL.

Referring to FIG. 3, when the one or more processing cores of the plurality of processing cores 308a-308n of the FE ASIC 306 receives one or more database instructions, such as when the data storage device 304 receives data to be stored at one of the NVM dies of the plurality of NVM dies 316a-316n, 322a-322n, the relevant processing core of the plurality of processing cores 308a-308n executes the database instruction at the relevant FM ASIC of the plurality of FM ASICs 310a-310n, where the relevant FM ASIC is configured to utilize the relevant FIM of the plurality of FIMs 314a-314n, 320a-320n to select, update, insert, and/or delete data at the relevant one or more NVM dies of the plurality of NVM dies 316a-316n. The tables below describe the power consumption and read performance for various embodiments. The embodiments illustrated in Tables 2-4 are not intended to be limiting, but to provide examples of possible embodiments.

TABLE 2

|  | Group Power Consumed (W) | Quantity | Power Per Component (W) |
| --- | --- | --- | --- |
| FE ASIC | 3.633 | 1 | 3.633 |
| FM ASIC(s) | 9.234 | 4 | 2.309 |
| DRAM | 0.39 | 10 | 0.039 |

TABLE 2-continued

| | Group Power Consumed (W) | Quantity | Power Per Component (W) |
|---|---|---|---|
| Plurality of Processing Cores | 2.000 | 1 | 2 |
| NVMs | 18.88 | 64 | 0.295 |
| Controller | 0.068 | 1 | 0.068 |
| Clock Generation | 0.068 | 1 | 0.068 |
| Serial Peripheral Interface (SPI) | 0.068 | 1 | 0.068 |
| Light-Emitting Diode (LED) | 0.068 | 1 | 0.068 |
| Total Power Supplied by Regulators (W) | | 34.409 | |
| Sequential Read Performance (MB/s) | | 42,132 | |
| Sequential Write Performance (MB/s) | | 4,896 | |
| Capacity (TB) | | 4.69 | |

Table 2 describes an embodiment where the data storage device includes BiCS 5 memory. The total power requirement for the data storage device is about 34.409 W, the sequential read performance is about 42,132 MB/s, the sequential write performance is about 4,896 MB/s, and the total capacity of the data storage device is about 4.69 TB.

TABLE 3

| | Group Power Consumed (W) | Quantity | Power Per Component (W) |
|---|---|---|---|
| FE ASIC | 3.633 | 1 | 3.633 |
| FM ASIC(s) | 4.617 | 2 | 2.309 |
| DRAM | 0.39 | 10 | 0.039 |
| Plurality of Processing Cores | 2.000 | 1 | 2 |
| NVMs | 13.92 | 32 | 0.435 |
| Controller | 0.068 | 1 | 0.068 |
| Clock Generation | 0.068 | 1 | 0.068 |
| SPI | 0.068 | 1 | 0.068 |
| LED | 0.068 | 1 | 0.068 |
| Total Power Supplied by Regulators (W) | | 24.832 | |
| Sequential Read Performance (MB/s) | | 55,201 | |
| Sequential Write Performance (MB/s) | | 6,827 | |
| Capacity (TB) | | 4.69 | |

Table 3 describes an embodiment where the data storage device includes BiCS 6 memory, such as the NVM dies 316a-316n, 322a-322n, and a low FBC, such as the low FBC embodiment described in FIG. 3. The total power requirement for the data storage device is about 24.832 W, the sequential read performance is about 55,201 MB/s, the sequential write performance is about 6,827 MB/s, and the total capacity of the data storage device is about 4.69 TB.

TABLE 4

| | Group Power Consumed (W) | Quantity | Power Per Component (W) |
|---|---|---|---|
| FE ASIC | 3.633 | 1 | 3.633 |
| FM ASIC(s) | 9.133 | 2 | 4.567 |
| DRAM | 0.39 | 10 | 0.039 |
| Plurality of Processing Cores | 2.000 | 1 | 2 |
| NVMs | 13.92 | 32 | 0.435 |
| Controller | 0.068 | 1 | 0.068 |
| Clock Generation | 0.068 | 1 | 0.068 |
| SPI | 0.068 | 1 | 0.068 |
| LED | 0.068 | 1 | 0.068 |
| Total Power Supplied by Regulators (W) | | 29.348 | |
| Sequential Read Performance (MB/s) | | 66,909 | |
| Sequential Write Performance (MB/s) | | 8,275 | |
| Capacity (TB) | | 5.68 | |

Table 4 describes an embodiment where the data storage device includes BiCS 6 memory and a high FBC, such as the high FBC embodiment described in FIG. 3. The total power requirement for the data storage device is about 29.348 W, the sequential read performance is about 66,909 MB/s, the sequential write performance is about 8,275 MB/s, and the total capacity of the data storage device is about 5.68 TB.

As shown in Tables 2-4, the data storage device, including a BiCS 6 memory, generally has a greater sequential read and write performance and a lower power consumption (i.e., total power supplied by regulators) than the data storage device including a BiCS 5 memory. The greater sequential read and write performance of the BiCS 6 memory may allow for greater database instruction execution completion times (i.e., select, insert, update, delete, etc.), where the values described in FIG. 4 may be improved (i.e., lower values).

By including a plurality of processing cores, a plurality of LDPC engines, and a plurality of FIMs each coupled to one or more NVM dies, where the one or more NVM dies is BiCS 6 memory, and the one or more NVM dies includes between about 12.5% to about 33.3% LDPC code or parity data, the BER may be reduced, the power consumption may be reduced, and the data throughput of the data storage may be increased.

In one embodiment, a data storage device is disclosed, comprising a front-end module ASIC (FM ASIC) comprising a plurality of LDPC engines, a plurality of flash interface modules (FIMs), each FIM coupled to a respective one of a plurality of NVM dies capable of storing data, and a front-end ASIC (FE ASIC) comprising a plurality of processing cores and coupled to the FM ASIC, configured to receive a database instruction from a host comprising one of a select, an insert, an update, and a delete instruction, and executing the database instruction with the plurality of processing cores within the data storage device.

The data storage device, where more than about 10.0% of the data stored on one of the plurality of NVM dies is parity data. The data storage device, where about 33.3% of the data stored on one of the plurality of NVM dies is parity data. The number of LDPC engines is less than about 54. The number of LDPC engines is less than or equal to about 14 LDPC engines. The number of processing cores is greater than about 5 processing cores. The number of processing cores is between about 256 processing cores and about 512 processing cores. The data storage device, where at least one of the plurality of NVM dies is a BiCS 6 die.

In another embodiment, a solid state storage device is disclosed, comprising a front-end ASIC (FE ASIC) configured to be coupled to a host, and a front-end module ASIC (FM ASIC) coupled to one or more NVM dies, and having a bit error rate (BER) of about 0.2 or less, the FM ASIC coupled to the FE ASIC.

The solid state storage device is configured to carry out database commands from a host upon data stored in the one or more NVM dies, including one of a select, an insert, and a delete instruction. The solid state storage device, where one of the one or more NVM dies comprises planes, wherein one of the planes of the one NVM die comprises parity data. The solid state drive, where about 33% of data on the one NVM die comprises the parity data. The one NVM die comprises a BiCS 6 NVM die. The FE ASIC comprises between about 256 processing cores to about 512 processing cores. The FM ASIC comprises less than about 54 LDPC engines. The FM ASIC comprises about 14 LDPC engines.

In another embodiment, a device for storing data is disclosed, comprising one or more memory means configured to store data, a front-end module ASIC (FM ASIC) means coupled to the one or more memory means, the FM ASIC means configure to have a bit error rate (BER) of less than at least about 0.2, and a front-end ASIC (FE ASIC) means coupled to the FM ASIC means, configured to carry out database commands from a host, the database commands comprising one of a select, an insert, and a delete.

The device for storing data is configured to cause about 33.3% of the stored data to be parity data. The FM ASIC means comprises about 8 LDPC engine means. The FE ASIC comprises about 256-512 processing means for carrying out the database commands While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a front-end module (FM) application-specific integrated circuit (ASIC) (FM ASIC) comprising a plurality of low density parity-check (LDPC) engines, and a plurality of flash interface modules (FIMs), each FIM coupled to a respective one of a plurality of non-volatile memory (NVM) dies capable of storing data; and
a front-end ASIC (FE ASIC) comprising a plurality of processing cores and coupled to the FM ASIC, configured to receive a database instruction from a host comprising one of a select, an update, an insert, and a delete instruction, and executing the database instruction with the plurality of processing cores within the data storage device.

2. The data storage device of claim 1, wherein more than 10.0% of the data stored on one of the plurality of NVM dies is parity data.

3. The data storage device of claim 2, wherein 33.3% of the data stored on one of the plurality of NVM dies is parity data.

4. The data storage device of claim 3, wherein at least one of the plurality of NVM dies is a bit cost scalable (BiCS) 6 die.

5. The data storage device of claim 2, wherein the number of LDPC engines is less than about 54.

6. The data storage device of claim 5, wherein the number of LDPC engines is less than or equal to 14 LDPC engines.

7. The data storage device of claim 1, wherein the number of processing cores is greater than 5 processing cores.

8. The data storage device of claim 7, wherein the number of processing cores is between 256 processing cores and 512 processing cores.

9. A solid state storage device, comprising:
a front-end (FE) application-specific integrated circuit (ASIC) (FE ASIC) configured to be coupled to a host; and
a front-end module ASIC (FM ASIC) coupled to one or more non-volatile memory (NVM) dies, and having a bit error rate (BER) of 0.2 or less, the FM ASIC coupled to the FE ASIC.

10. The solid state storage device of claim 9, configured to carry out database commands from a host upon data stored in the one or more NVM dies, comprising one of a select, an insert, an update, and a delete instruction.

11. The solid state storage device of claim 9, wherein one of the one or more NVM dies comprises planes, wherein one of the planes of the one NVM die comprises parity data.

12. The solid state storage device of claim 11, wherein 33.3% of data on the one NVM die comprises the parity data.

13. The solid state storage device of claim 12, wherein the FM ASIC comprises fewer than 54 low-density parity-check (LDPC) engines.

14. The solid state storage device of claim 13, wherein the FM ASIC comprises 14 LDPC engines.

15. The solid state storage device of claim 11, wherein the one NVM die comprises a bit cost scalable (BiCS) 6 NVM die.

16. The solid state storage device of claim 9, wherein the FE ASIC comprises between 256 processing cores to 512 processing cores, inclusive.

17. A device for storing data, comprising:
one or more memory means configured to store data;
a front-end module (FM) application-specific integrated circuit (ASIC) (FM ASIC) means coupled to the one or more memory means, the FM ASIC means configured to have a bit error rate (BER) of less than 0.2; and
a front-end ASIC (FE ASIC) means coupled to the FM ASIC means, configured to carry out database commands from a host, the database commands comprising one of a select, an insert, an update, and a delete.

18. The device for storing data of claim 17, configured to cause 33.3% of the stored data to be parity data.

19. The device for storing data of claim 18, wherein the FM ASIC means comprises 8 low-density parity-check (LDPC) engine means.

20. The device for storing data of claim 17, wherein the FE ASIC comprises 256-512 processing means for carrying out the database commands.

* * * * *